United States Patent [19]
Kohno et al.

[11] Patent Number: 5,808,332
[45] Date of Patent: Sep. 15, 1998

[54] FIELD-EFFECT SEMICONDUCTOR DEVICE

[75] Inventors: Yasutaka Kohno, deceased, late of Ehime, Japan, by Yoko Kohno, Yasutaka Kohno, heirs; Akira Inoue, Hyogo, Japan

[73] Assignee: Mitsubishi Denki Kabushiki Kaisha, Tokyo, Japan

[21] Appl. No.: 530,446

[22] Filed: Sep. 19, 1995

[30] Foreign Application Priority Data

Mar. 14, 1995 [JP] Japan .................................. 7-054565

[51] Int. Cl.⁶ .................... H01L 29/80; H01L 31/0328
[52] U.S. Cl. ................... 257/280; 257/284; 257/192
[58] Field of Search .................... 257/279, 280, 257/284, 286, 192, 194

[56] References Cited

U.S. PATENT DOCUMENTS

| | | | |
|---|---|---|---|
| 5,023,674 | 6/1991 | Hikosaka et al. | 257/194 |
| 5,151,757 | 9/1992 | Enoki et al. | 257/194 |
| 5,223,724 | 6/1993 | Green, Jr. | 257/280 |
| 5,250,822 | 10/1993 | Sonoda et al. | 257/192 |
| 5,266,506 | 11/1993 | Green, Jr. | 257/192 |
| 5,404,032 | 4/1995 | Sawada et al. | 257/194 |
| 5,532,507 | 7/1996 | Wada | 257/280 |

FOREIGN PATENT DOCUMENTS

| | | | |
|---|---|---|---|
| 60-9172 | 1/1985 | Japan . | |
| 61-95570 | 5/1986 | Japan . | |
| 6-267994 | 9/1994 | Japan | 257/192 |

OTHER PUBLICATIONS

Aucoin et al., "Large Periphery, High Power Pseudomorphic HEMTS", GaAs IC Symposium Technical Digest, 1993, pp. 351–353, No Month.

Macksey, "Optimization Of The n⁺Ledge Channel Structure For GaAs Power FET's", IEEE Transactions on Electron Devices, vol. ED–33, No. 11, 1986, pp. 1818–1824, No Month.

*Primary Examiner*—Wael Fahmy
*Attorney, Agent, or Firm*—Leydig, Voit & Mayer, Ltd.

[57] ABSTRACT

A depletion layer forming element, for instance, a low impurity concentration layer, is provided between a gate electrode and a source or drain electrode. The depletion layer forms a surface depletion layer closer to a semiconductor substrate than a depletion layer formed in an active layer opposite the gate electrode. Alternatively, the depletion layer forming element is a reduced thickness portion of the active layer.

8 Claims, 8 Drawing Sheets

FIELD-EFFECT SEMICONDUCTOR DEVICE

BACKGROUND OF THE INVENTION

The present invention relates to a field-effect semiconductor device and, more specifically, to the device structure of a high-output-power, high-efficiency GaAs Schottky-gate field-effect transistor.

Figure 14:
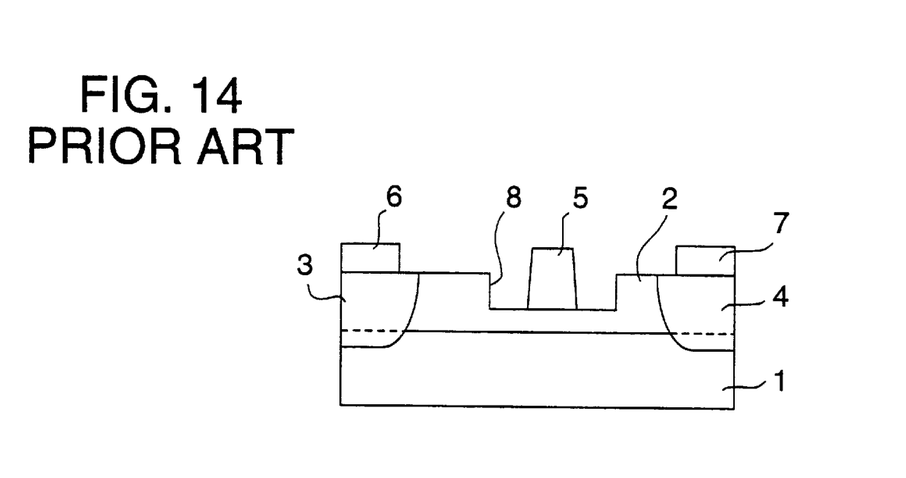
FIG. 14 is a sectional view of a conventional MESFET.

FIG. 14 is a sectional view of an example of a conventional field-effect semiconductor device, which is a high-output-power, recessed GaAs Schottky-gate field-effect transistor for microwave devices. In the following description, the Schottky-gate field-effect transistor is abbreviated as "MESFET."

In FIG. 14, reference numeral 1 denotes a semi-insulating GaAs substrate, and numeral 2 denotes an n-GaAs active layer. Further, reference numerals 3 and 4 denote heavily doped n-type regions; 5, a gate finger; 6, a source electrode; 7, a drain electrode; and 8, a recess.

The operation of the above GaAs MESFET will be described below.

The active layer 2 is disposed on the semi-insulating GaAs substrate 1. The source electrode 6 and the drain electrode 7 are disposed on the active layer 2 as ohmic contacts, and the gate finger 5 is disposed on the active layer 2 and forms a Schottky junction. When a prescribed drain voltage $V_{ds}$ is applied between the source electrode 6 and the drain electrode 7, a drain current $I_{ds}$ flows between those electrodes. The drain current $I_{ds}$ is modulated by varying the expanse of the Schottky barrier depletion layer by changing a gate voltage $V_{gs}$ applied between the gate finger 5 and the source electrode 6.

Figure 15:
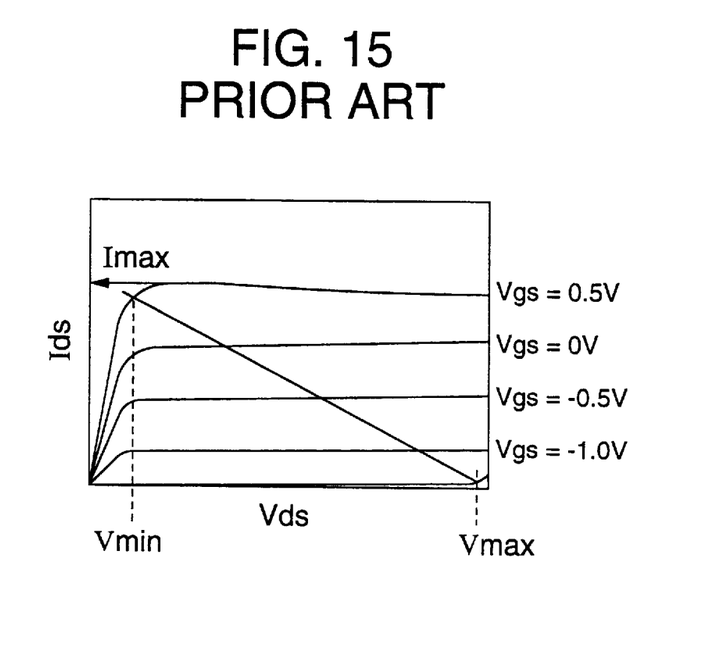
FIG. 15 is a graph showing an I-V characteristic of the conventional MESFET of FIG. 14.

FIG. 15 is a graph showing an I-V characteristic of the conventional MESFET. The horizontal axis represents the drain voltage $V_{ds}$, the vertical axis represents the drain current $I_{ds}$, and the parameter is the gate bias $V_{gs}$.

Referring to FIG. 15, when the gate bias $V_{gs}$ is a positive voltage, the transconductance $G_m$, which is an increase of the drain current $I_{ds}$ divided by an increase of the gate voltage $V_{gs}$, decreases, being influenced by the expanse of the surface depletion layer adjacent to the gate finger 5 in the recess 8.

In the case of class-A amplification, output power $P_{out}$ of the MESFET is expressed as $$P_{out}=(V_{max}-V_{min})I_{max}/8$$

where $I_{max}$ is the maximum drain current and $V_{max}$ and $V_{min}$ are shown in FIG. 15.

It is understood that to increase the output power of the MESFET, the maximum drain current $I_{max}$ needs to be increased.

One method of increasing the maximum drain current $I_{max}$ to increase the output power of the MESFET is to increase the total gate width by arranging a number of gate fingers 5, i.e., connecting together a number of MESFETs in parallel.

However, as the gate width increases, operation of the individual MESFETs become nonuniform. Further, varied microwave phases associated with the gate arrangement and other factors reduce the gain and added power efficiency.

In view of this problem, it is now attempted to develop a high-efficiency MESFET for high power use by increasing the output power without increasing the total gate width, i.e., increasing the power density of the MESFET.

Figure 16:
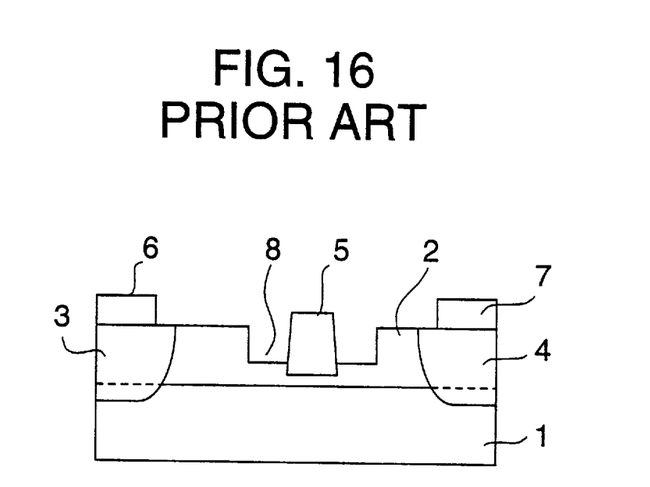
FIG. 16 is a sectional view of a conventional high-efficiency MESFET for high power use.

FIG. 16 is a sectional view of a conventional high-efficiency MESFET for high power use.

As shown in FIG. 16, the gate finger 5 is partially buried in the active layer 2. This structure is effective in making the gate finger 5 less susceptible to the surface depletion layer. As the gate finger 5 is buried in the active layer more deeply, it becomes less susceptible to the effects of surface states.

Figure 17:
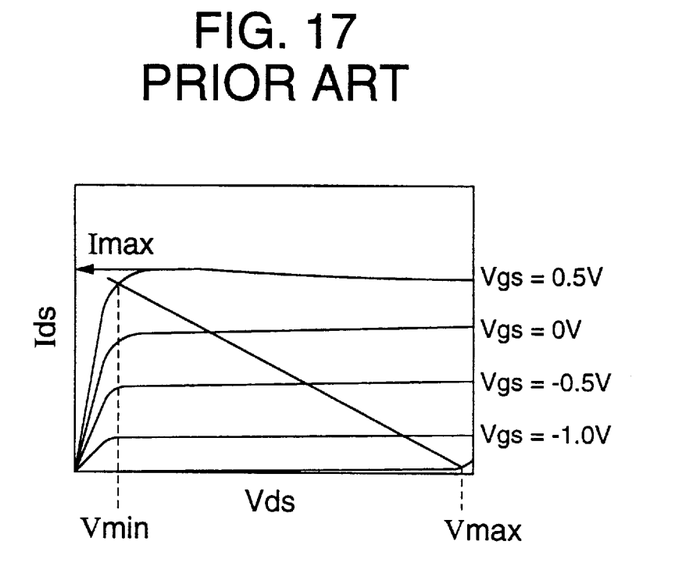
FIG. 17 is a graph showing an I-V characteristic of the conventional high-efficiency MESFET of FIG. 16.

FIG. 17 is a graph showing an I-V characteristic of the MESFET of FIG. 16. The horizontal axis represents the drain voltage $V_{ds}$, the vertical axis represents the drain current $I_{ds}$, and the parameter is the gate bias $V_{gs}$. From FIG. 17, it is understood that the maximum drain current $I_{max}$ is increased.

Figure 18:
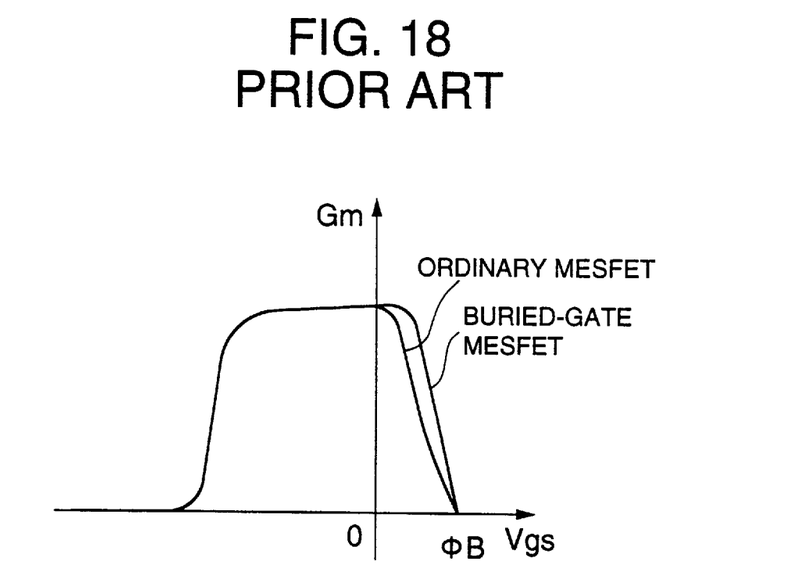
FIG. 18 is a graph showing a transconductance of the conventional high-efficiency MESFET of FIG. 16.

FIG. 18 is a graph showing the transconductance $G_m$ of the MESFET of FIG. 16, in which the horizontal axis represents the gate bias $V_{gs}$, and the vertical axis represents the transconductance $G_m$.

As seen from FIG. 18, the reduction of the transconductance $G_m$ in the positive gate bias range is suppressed as much as the influence of the surface depletion layer is reduced, resulting in the increase of $I_{max}$.

However, the burying of the gate finger 5 in the active layer 2 increases the gate-drain capacitance $C_{gd}$, thereby decreasing the gain.

In the case of class-A amplification, the added power efficiency $\eta_{add}$ is expressed as $$\eta_{add}=(G-1)P_{in}/P_{dc},$$

where G is the gain, $P_{in}$ is the input power, and $P_{dc}$ is the applied dc power. The applied dc power $P_{dc}$ is defined by the dc component of the drain current multiplied by the drain bias voltage.

Therefore, the gain reduction causes a problem of a decrease of the added power efficiency $\eta_{add}$.

Further, to increase the efficiency in terms of the circuit configuration, it is also attempted to change the amplification scheme from class-A to class-AB and to class-B. It has been proved experimentally and theoretically that efficiency is improved in that order.

However, since the output power and the gain decrease as the amplification scheme becomes closer to class-B, usually there is no other way of determining the amplification scheme than making a tradeoff between gain and efficiency.

SUMMARY OF THE INVENTION

The present invention has been made to solve the above-described problems, and has an object of providing a high-output-power, high-efficiency field effect transistor.

According to a first aspect of the invention, there is provided a field-effect semiconductor device comprising a semi-insulative semiconductor substrate; a first semiconductor layer formed on one major surface of the semiconductor substrate; a control electrode formed on the first semiconductor layer; first and second electrodes formed on the first semiconductor layer so as to be opposed to each other with the control electrode interposed in between; and depletion layer forming means provided between the control electrode and the first electrode or the second electrode, for forming a depletion layer therein so that an end of the depletion layer is closer to the semiconductor substrate than an end of a depletion layer formed in the first semiconductor layer by means of the control electrode.

As a more specific configuration, there is provided a field-effect semiconductor device comprising a semi-insulative semiconductor substrate; a first semiconductor layer formed on one major surface of the semiconductor substrate; a control electrode formed on the semiconductor layer; first and second electrodes formed on the first semiconductor layer so as to be opposed to each other with the control electrode interposed in between; and a second semiconductor layer provided between the control electrode and the first electrode or the second electrode, and having an impurity concentration lower than that of the first semiconductor layer.

There are also provided a field-effect semiconductor device comprising a semi-insulative semiconductor substrate; a first semiconductor layer formed on one major surface of the semiconductor substrate; a control electrode formed on the semiconductor layer; first and second electrodes formed on the first semiconductor layer so as to be opposed to each other with the control electrode interposed in between; and a thinned portion of the first semiconductor layer provided between the control electrode and the first electrode or the second electrode.

Further, there is provided a field-effect semiconductor device comprising a semi-insulative semiconductor substrate; a first semiconductor layer formed on one major surface of the semiconductor substrate; first and second control electrodes formed side by side on the first semiconductor layer; first and second electrodes formed on the first semiconductor layer so as to be opposed to each other with the first and second control electrodes interposed in between; and a power supply circuit having an output terminal connected to the second control electrode, for generating an output voltage so that a depletion layer formed in the first semiconductor layer by means of the second control electrode is thicker than a depletion layer formed in the first semiconductor layer by means of the first control electrode being supplied with an input signal.

According to the first aspect of the invention described above, carrier movement between the first and second electrodes is suppressed, so that the characteristic curve representing the relationship between the output signal and the voltage applied between the first and second electrodes is made less sensitive to a variation of the control voltage that is larger than a prescribed value. As a result, the output signal can be distorted when the input signal is large and therefore the dc component of the output signal is reduced. This enables provision of highly efficient devices.

In the last-mentioned field-effect semiconductor device, the power supply circuit may be a constant voltage circuit, or a feedback circuit for generating a feedback voltage corresponding to an output power at one of the first and second electrodes. Therefore, the power supply circuit can be constructed as a simple circuit, which enables provision of less expensive devices.

In the field-effect semiconductor device according to the first aspect of the invention, the semiconductor may be gallium arsenide, which provides a high electron mobility and a semi-insulative substrate. As a result, high-performance devices can be obtained which operate at high speed with less power consumption.

According to a second aspect of the invention, there is provided a field-effect semiconductor device comprising a semi-insulative semiconductor substrate made of a first semiconductor; a first semiconductor layer made of the first semiconductor and formed on the semiconductor substrate; a second semiconductor layer made of a second semiconductor, having the same conductivity type as the first semiconductor layer, and formed on the first semiconductor layer so as to form a hetero junction; a third semiconductor layer made of the first semiconductor, having the same conductivity type as the first semiconductor layer, and selectively formed on the second semiconductor layer so as to form a hetero junction; first and second electrodes formed on the third semiconductor layer so as to be opposed to each other; and a control electrode formed on or over the second semiconductor layer between the first and second electrodes.

With this configuration, there exists a hetero junction barrier at four locations which acts on carriers moving between the first and second electrodes. There is a discontinuity of the saturation output signal at a threshold voltage that is a voltage between the first and second electrodes necessary for carriers to clear those hetero junction barriers. Therefore, the output signal can be distorted when the input signal is large and therefore the dc component of the output signal can be reduced. This enables provision of high-output-power, highly efficient devices.

In the above field-effect semiconductor device, the control electrode may be formed on the third semiconductor layer. In this case, there are two active layers, i.e., the first and third semiconductor layers. When the voltage applied between the first and second electrodes is low, carriers move through the first semiconductor layer. On the other hand, when the voltage applied between the first and second electrodes exceeds the threshold value, carriers moves through both of the first and third semiconductor layers, to cause a discontinuity of the saturation output signal, which provides the same advantages as mentioned above.

Alternatively, the control electrode may be formed directly on the second semiconductor layer. In this case, there is only one active layer, i.e., the first semiconductor layer. When the voltage applied between the first and second electrodes is small, carriers do not move. On the other hand, when the voltage applied between the first and second electrodes exceeds the threshold value, carriers are allowed to move, to cause a discontinuity of the saturation output signal, which provides the same advantages as mentioned above.

As a further alternative, there is provided a field-effect semiconductor device comprising a semi-insulative semiconductor substrate made of a first semiconductor; an insulative, first semiconductor layer made of a second semiconductor and formed on the semiconductor substrate; a second semiconductor layer made of the first semiconductor and formed on the first semiconductor layer so as to form a hetero junction; first and second electrodes formed on the second semiconductor layer so as to be opposed to each other; and a control electrode formed on the second semiconductor layer between the first and second electrodes.

With this configuration, the crystallinity of the first semiconductor layer is reduced at a portion close to the boundary between the first and second semiconductor layers. When the voltage applied between the first and second electrodes exceeds the threshold value, carriers are generated by collision ionization in that portion, to increase carrier movement to one of those electrodes. Thus, there is caused a discontinuity of the saturation output signal, which provides the same advantages as mentioned above. Further, an additional advantage is provided that the device configuration is simple.

In the field-effect semiconductor device according to the second aspect of the invention, the first semiconductor may be gallium arsenide and the second semiconductor may be aluminum gallium arsenide. This allows formation of a stable hetero junction structure, to enable provision of highly reliable devices.

DESCRIPTION OF THE PREFERRED EMBODIMENTS

Embodiment 1

Figure 1:
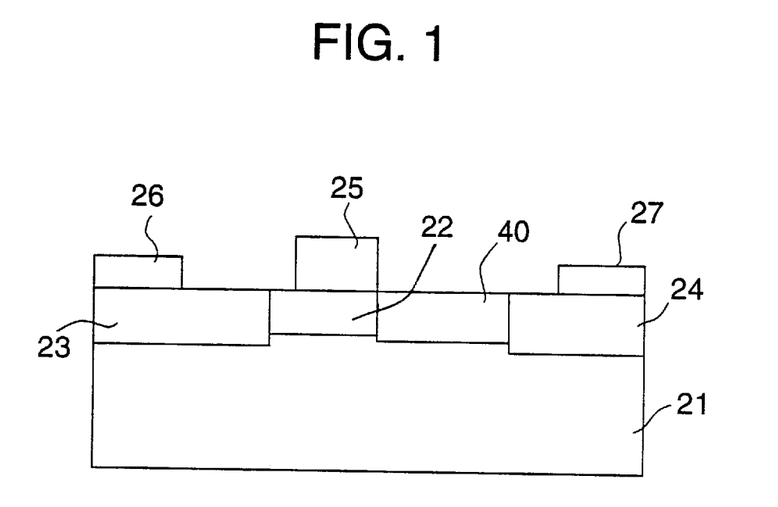
FIG. 1 is sectional view of a MESFET according to a first embodiment of the present invention.

FIG. 1 is a sectional view of an example of a field-effect semiconductor device, which is a GaAs Schottky-gate field-effect transistor (GaAs MESFET). This type of GaAs MESFET is used as a high-output-power microwave amplification device mounted on, for instance, an artificial satellite, and has an output power of several tens of watts.

In FIG. 1, reference numeral 21 denotes a semi-insulating GaAs substrate (semiconductor substrate); 22, an n-GaAs active layer (first semiconductor layer); 23 and 24, heavily doped n-type regions; 25, a gate electrode (control electrode); 26, a source electrode (first electrode); 27, a drain electrode (second electrode); and 40, an n⁻-GaAs region (depletion layer forming means and a second semiconductor region).

ICs made of GaAs can operate at high speed and with low power consumption because of a high electron mobility and an insulating semiconductor substrate.

Referring to FIG. 1, the n-GaAs active layer 22 is formed by epitaxial growth on the major surface of the semi-insulating GaAs substrate 21. The gate electrode 25 is provided on the active layer 22 and forms a Schottky junction. The source electrode 26 and the drain electrode 27 are provided on the active layer 22 opposed to each other with the gate electrode 25 interposed in between and form ohmic contacts with the active layer 22. The heavily doped n-type regions 23 and 24 reduce resistivity of portions of the active layer 22 in the vicinity of the source electrode 26 and the drain electrode 27, respectively. The n⁻-GaAs region 40, having a dopant impurity concentration is lower than the active layer 22, located between the active layer 22 on which the gate electrode 25 is disposed and the heavily doped region 24 that is adjacent to the drain electrode 27.

Alternatively, the n⁻-GaAs region 40 may be provided between the active layer 22 on which the gate electrode 25 is disposed and the heavily doped region 23 that is adjacent to the source electrode 26.

The n⁻-GaAs region 40, the active layer 22 and the heavily doped regions 23 and 24 have dopant impurity concentrations of $0.1 \times 10^{17}$ to $3 \times 10^{17}$ cm$^{-3}$, $1 \times 10^{17}$ to $10 \times 10^{17}$ cm$^{-3}$, and $10 \times 10^{17}$ to $30 \times 10^{17}$ cm$^{-3}$, respectively.

The operation of the above MESFET will be described below.

In general, in a GaAs MESFET, a surface depletion layer develops so as to compensate, with donors in GaAs, negative charge due to electrons trapped by GaAs surface states. The surface potential of GaAs is known to be at most comparable to the Schottky barrier height though it depends on the fabrication method of the GaAs MESFET.

Therefore, by forming the n⁻-GaAs region 40 as in this embodiment, its surface depletion layer serves as a quasi-gate depletion layer. Where the quasi-gate depletion region is thicker than the gate depletion layer at a prescribed gate bias value, there does not occur a marked increase of the drain current even if the gate bias $V_{gs}$ is increased to a value higher than the prescribed value.

Figure 2:
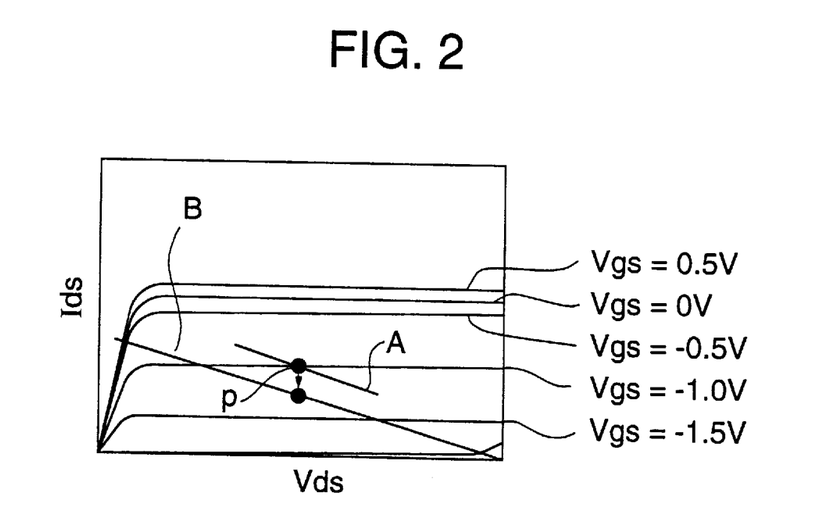
FIG. 2 is a graph showing an I-V characteristic of the MESFET of the first embodiment.

FIG. 2 is a graph showing an I-V characteristic of the GaAs MESFET of this embodiment. The horizontal axis represents the drain voltage $V_{ds}$, the vertical axis represents the drain current $I_{ds}$, and the parameter is the gate bias $V_{gs}$. The straight line A is a load line where the input level is low, and p denotes an operating point. The straight line B is a load line where the input level is high.

Referring to FIG. 2, the impurity concentration of the n⁻-GaAs region 40 is lower than in the active layer 22 so that the surface depletion layer of the n⁻-GaAs region 40 is thicker than the gate depletion layer when the gate bias $V_{gs}=-0.5$ V. Therefore, when the gate bias $V_{gs}$ is increased from −0.5 V, the drain current $I_{ds}$ does not exhibit a marked increase; that is, the intervals between the I-V curves corresponding to the respective gate biases are small between $V_{gs}=-0.5$ V to 0.5 V.

Figure 3:
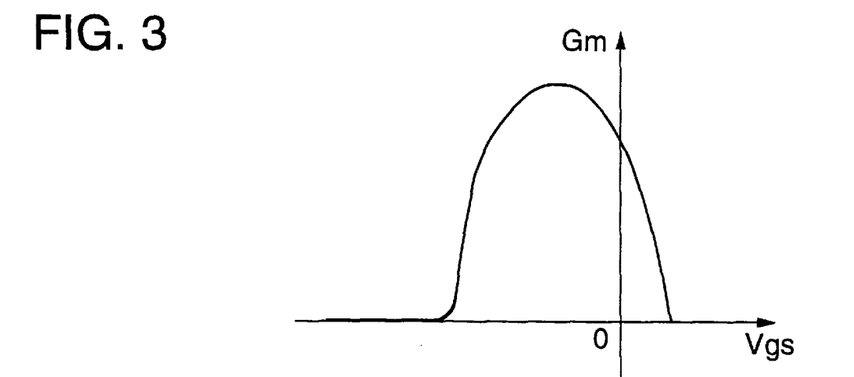
FIG. 3 is a graph showing a dependence of the transconductance on the gate-source voltage of the MESFET of the first embodiment.

FIG. 3 is a graph showing a dependence of the transconductance $G_m$ on the gate-source voltage $V_{gs}$. A reduction of the transconductance $G_m$ is found on the high-voltage side of the gate bias $V_{gs}$.

When radio frequency (hereinafter abbreviated as RF) or higher power frequency is applied to the gate of the GaAs MESFET having the above I-V characteristic of FIG. 2, the drain current waveform varies with the RF input power level.

Figure 4:
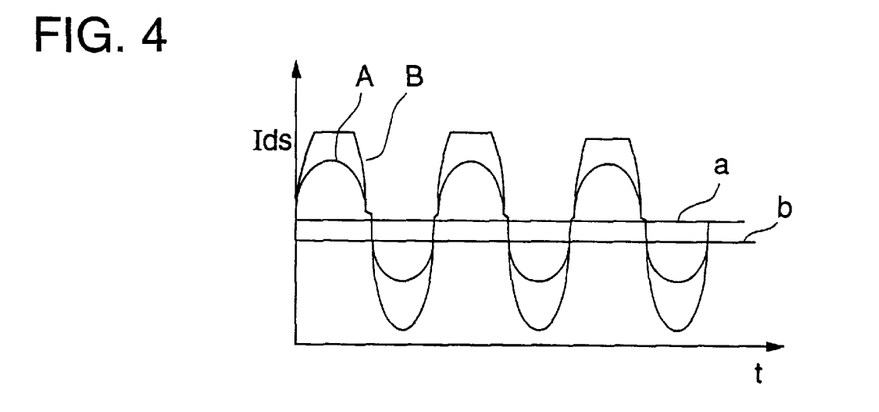
FIG. 4 is a graph showing drain current waveforms of the MESFET of FIG. 1 corresponding to two RF input power levels.

FIG. 4 is a graph showing drain current waveforms of the GaAs MESFET of this embodiment corresponding to two RF input power levels. The horizontal axis represents time t and the vertical axis represents the drain current $I_{ds}$. Waveforms A and B correspond to a small input power level and a large input power level, respectively. Straight lines a and b are dc components of waveforms A and B, respectively.

Referring to FIGS. 2–4, a description will be made of why the GaAs MESFET of this embodiment has high efficiency.

Assume that RF power is input with the operating point set at p as shown in FIG. 2. When the input signal is small, the load line 15 becomes line A and the RF drain current waveform is the sine wave A shown in FIG. 4. The dc component of the drain current $I_{ds}$ is represented by line a and has the same value as the operating point p.

When a large input signal is applied to the GaAs MESFET having the I-V characteristic shown in FIG. 2, the load line is clipped on the low-voltage side of the gate bias $V_{gs}$. Therefore, the RF drain current waveform becomes waveform B of FIG. 4, which is distorted on the large drain current side. The average drain current, i.e., the dc component of the drain current $I_{ds}$ is represented by line b, whose level is lower than line a. As a result, the applied dc power $P_{dc}$ is reduced while the power-added efficiency $\eta_{add}$ is increased.

In the class-AB or class-B amplification, in which the operating point is originally low, the dc component of the RF drain current $I_{ds}$ tends to increase with an increase of the amplitude of the input signal. In contrast, in the GaAs MESFET having the I-V characteristic shown in FIG. 2, as in this embodiment, the dc component of the drain current $I_{ds}$ is decreased while the efficiency is improved.

Although the foregoing description is directed to an I-V characteristic that is observed in a dc-like manner, the invention is not limited to such a case. That is, a pulsed I-V characteristic obtained by applying a pulsed gate voltage about several nanoseconds to several milliseconds long to a GaAs MESFET, rather than a dc I-V characteristic, may have the characteristic as shown in FIG. 2. This is because with RF input power the gate voltage varies sinusoidally.

Embodiment 2

Figure 5:
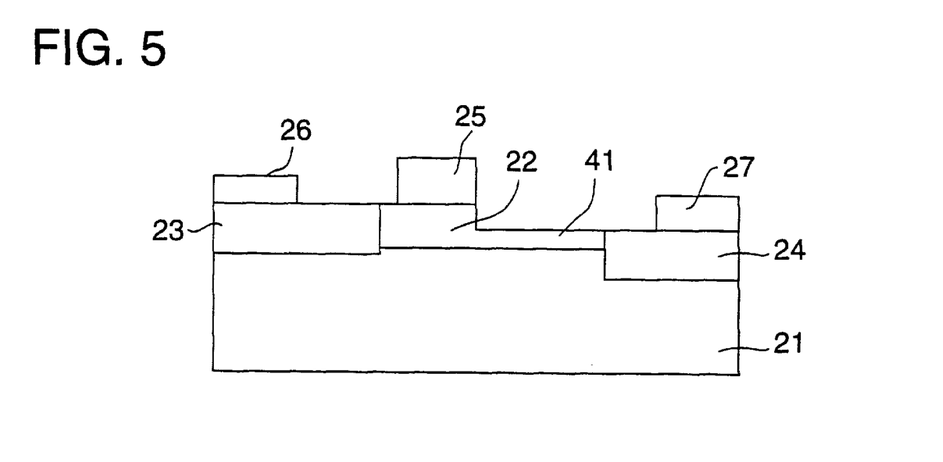
FIG. 5 is a sectional view of a MESFET according to a second embodiment of the invention.

FIG. 5 is a sectional view of a GaAs MESFET according to a second embodiment of the invention.

In FIG. 5, reference numeral 41 denotes a step portion, i.e., a thinned portion of the active layer 22, which portion is depletion layer forming means. The other reference numerals denote the same parts as in the first embodiment.

In this embodiment, a portion of the active layer 22 adjacent to the gate electrode 25 is removed to form the step portion 41. The distance between the surface of the n-GaAs active layer 22 and the boundary between the active layer 22 and the GaAs substrate 21 in the step portion 41 is smaller than that in the portion of the active layer 22 on which the gate electrode 25 is present.

Therefore, the end of the surface depletion layer of the step portion 41 is closer to the boundary between the active layer 22 and the GaAs substrate 21 than to the end of the gate depletion layer. By forming the step portion 41 so that the end of the surface depletion layer of the step portion 41 is closer to the boundary between the active layer 22 and the GaAs substrate 21 than to the end of the gate depletion layer, as in the case of the first embodiment, when a prescribed gate bias $V_{gs}$ is applied, a feature is obtained that when the gate bias $V_{gs}$ is increased from the prescribed value, the drain current $I_{ds}$ does not exhibit a marked increase.

The GaAs MESFET of this embodiment has an I-V characteristic similar to that of FIG. 2. Therefore, as described in connection with the operation of the first embodiment, the applied dc power $P_{dc}$ is reduced while the added power efficiency $\eta_{add}$ is increased.

Although in this embodiment only the drain-side portion of the active layer 22 adjacent to the gate electrode 25 is removed to form the step portion 41, the source-side portion of the active layer 22 may also be removed to form a step portion 41.

Embodiment 3

Figure 6:
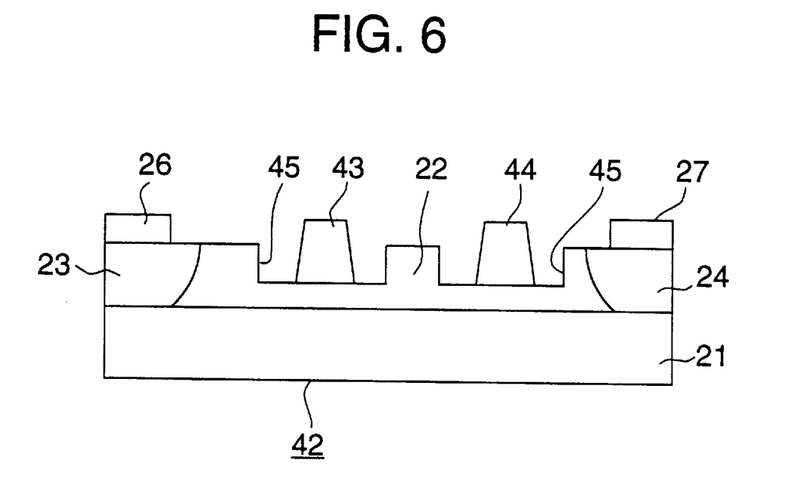
FIG. 6 is a sectional view of a dual-gate GaAs MESFET, which is part of a MESFET according to a third embodiment of the invention.

FIG. 6 is a sectional view of a dual-gate GaAs MESFET, which is part of a GaAs MESFET according to a third embodiment of the invention. In FIG. 6, reference numeral 42 denotes a dual-gate GaAs MESFET; 43, a gate electrode (first control electrode); 44, a control gate electrode (second control electrode); and 45, recesses. The other reference numerals denote the same parts as in the first embodiment.

Figure 7:
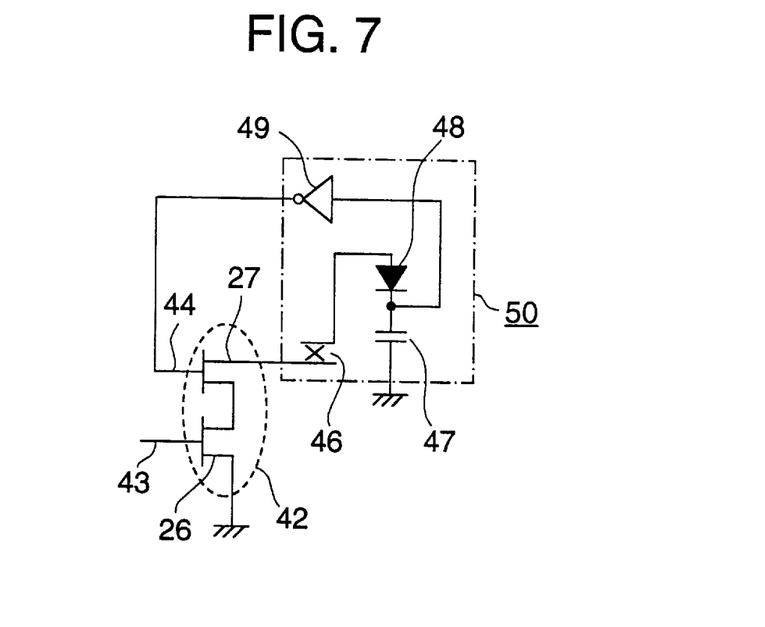
FIG. 7 is a circuit diagram showing a configuration of the MESFET according to the third embodiment.

FIG. 7 is a circuit diagram showing a configuration of the GaAs MESFET according to this embodiment. In FIG. 7, reference numeral 42 denotes the dual-gate GaAs MESFET; 43, the gate electrode; 44, the control gate electrode; 46, a coupler; 47, a smoothing capacitor; 48, a detection diode; 49, an inverter circuit; and 50, a feedback circuit (power supply circuit). The control gate electrode 44 and the feedback circuit 50 are part of a depletion layer forming means.

Referring to FIG. 6, the dual-gate GaAs MESFET 42 is constructed as follows. The n-GaAs active layer 22 is formed, by epitaxial growth, on one major surface of the semi-insulating GaAs substrate 21. The recesses 45 are formed side by side in the surface of the active layer 22. The gate electrode 43 and the control gate electrode 44 are formed in the respective recesses to form Schottky junctions. The source electrode 26 and the drain electrode 27, which are ohmic electrodes, are formed on the active layer 22 opposed to each other with the gate electrode 43 and the control gate electrode 44 interposed in between. Further, to reduce resistivity, the heavily doped n-type regions 23 and 24 are formed in portions of the active layer 22 adjacent to the source electrode 26 and the drain electrode 27.

Referring to FIG. 7, the drain electrode 27 of the dual-gate GaAs MESFET 42 is connected to the anode of the detection diode 48 via the coupler 46. The cathode of the detection diode 48 is grounded via the smoothing capacitor 47. The connecting point of the cathode of the detection diode 48 and the smoothing capacitor 47 is connected to the control gate electrode 44 via the inverter circuit 49. The source electrode 26 of the dual-gate GaAs MESFET 42 is grounded.

Next, the operation of the above GaAs MESFET will be described.

An output signal is produced from the drain electrode 27 of the dual-gate GaAs MESFET 42 in accordance with an input signal to the gate electrode 43. The output signal is detected by the detection diode 48 and the smoothing capacitor 47, and a resulting dc component voltage is inverted by the inverter circuit 49 and applied to the control gate electrode 44 as a negative feedback voltage.

Figure 8:
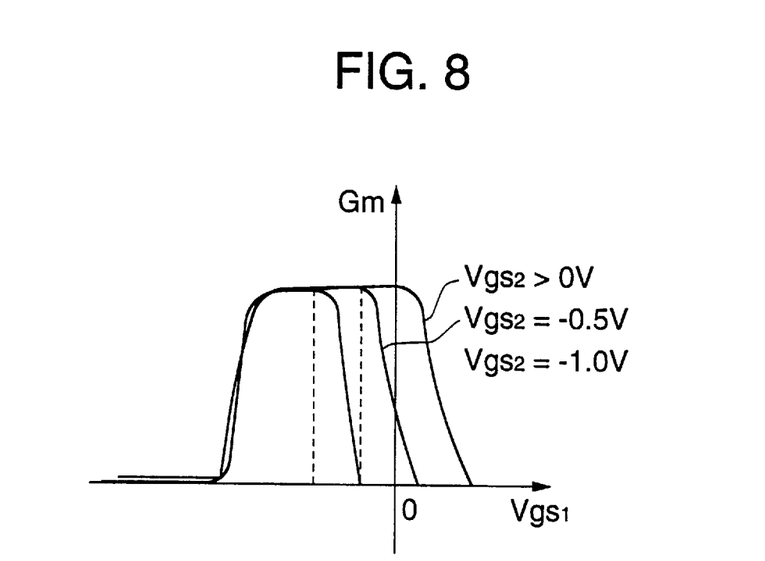
FIG. 8 is a graph showing a dependence of the transconductance of the MESFET of the third embodiment on the voltage applied to its control gate electrode.

FIG. 8 is a graph showing a dependence of the transconductance $G_m$ of the GaAs MESFET of this embodiment on the voltage applied to the control gate electrode 44. The horizontal axis represents the transconductance $G_m$, the vertical axis represents a gate-source voltage $V_{gs1}$, and the parameter is a control gate-source voltage $V_{gs2}$.

The dependence shown in FIG. 8 is similar to the dependencies of the transconductance $G_m$ on the gate-source voltage $V_{gs}$ in the first and second embodiments.

With the feedback voltage applied to the control gate electrode 44, the depletion layer associated with the control gate electrode 44 serves in the same manner as the GaAs surface depletion layer in the first and second embodiments. That is, by applying, to the control gate electrode 44, a control voltage that is a feedback signal of an output signal from the drain electrode 27, which is produced in accordance with an input signal to the gate electrode 43, the depletion layer in the portion of the active layer under the control gate electrode 44 becomes thicker than the depletion layer in the portion of the active layer 22 under the gate electrode 43. As a result, there does not occur a marked increase of the drain current on the high gate voltage side.

Therefore, when RF power is input to the gate electrode 43, the DC component of the RF drain current can be reduced while the efficiency can be increased.

Although this embodiment uses the inverter circuit 49, it may be replaced by an operation circuit that generates an operated voltage in accordance with the detected voltage of an output power.

Further, a constant voltage circuit may be connected between the control gate electrode 44 and the source electrode 26.

Embodiment 4

Figure 9:
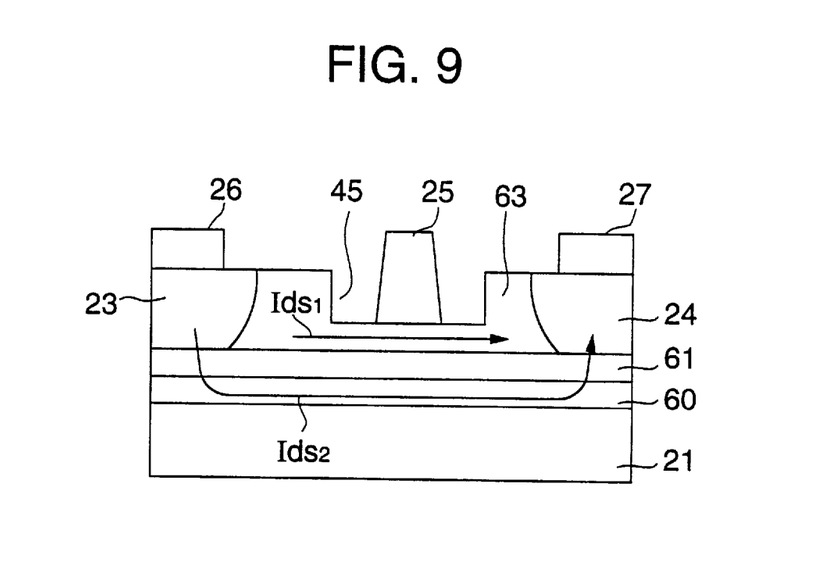
FIG. 9 is a sectional view of a MESFET according to a fourth embodiment of the invention.

FIG. 9 is a sectional view of a GaAs MESFET according to a fourth embodiment of the invention.

In FIG. 9, reference numeral 60 denotes a second active layer, i.e., an n-GaAs layer (first semiconductor layer made of a first semiconductor); 61, an n-AlGaAs layer (second semiconductor layer made of a second semiconductor); 63, a first active layer, i.e., an n-GaAs layer (third semiconductor layer made of the first semiconductor). The other reference numerals denote the same parts as in the first embodiment.

The second active layer 60 (n-GaAs layer) has a dopant concentration of $6 \times 10^{17}$ cm$^{-3}$ and a thickness of 300 Å. The n-AlGaAs layer 61 has an Al proportion X of 0.24, a dopant concentration of $5 \times 10^{16}$ cm$^{-3}$, and a thickness of 300 Å.

Referring to FIG. 9, the second active layer 60 (n-GaAs layer) is epitaxially grown on one major surface of the semi-insulative GaAs substrate 21. The n-AlGaAs layer 61 is epitaxially grown on the surface of the second active layer 60 to form a heterojunction. Further, the first active layer 63 is epitaxially grown on the surface of the n-AlGaAs layer 61 to form a second heterojunction. A recess 45 is formed in the surface of the first active layer 63, and the gate electrode 25 is formed on the surface of the recess 45 to form a Schottky junction. The source electrode 26 and the drain electrode 27 (ohmic electrodes) are formed on the surface of the first active layer 63 opposed to each other with the gate electrode 25 interposed in between. Further, to reduce resistivity, the heavily doped n-type regions 23 and 24 are formed in portions of the first active layer 63 adjacent to the source electrode 26 and the drain electrode 27 respectively.

Next, the operation of the MESFET of this embodiment will be described.

When a voltage is applied between the source electrode 26 and the drain electrode 27 of the GaAs MESFET having the configuration shown in FIG. 9, a drain current flows along two paths in the first active layer 63 and in the second active layer 60. However, to reach the drain electrode 27, electrons from the source electrode 26 need to pass over four n-GaAs/n-AlGaAs heterojunction barriers. In particular, the heterojunction barrier between the first active layer 63 and the n-AlGaAs layer 61 at the source electrode 26 and the heterojunction barrier between the second active layer 60 and the n-AlGaAs layer 61 at the drain electrode 27 are in the same state as a reversely biased diode. Thus, no current flows through the second active layer 60 unless the drain voltage $V_{ds}$ exceeds a prescribed threshold voltage.

Therefore, when the drain voltage $V_{ds}$ is lower than the threshold voltage, a drain current $I_{ds1}$ flows through the first active layer 63. When the drain voltage $V_{ds}$ exceeds the threshold voltage, a drain current $I_{ds2}$ flowing through the second active layer 60 is added to $I_{ds1}$ flowing through the first active layer 63. Thus, the saturation drain current increases in a drain voltage range higher than a prescribed value.

Figure 10:
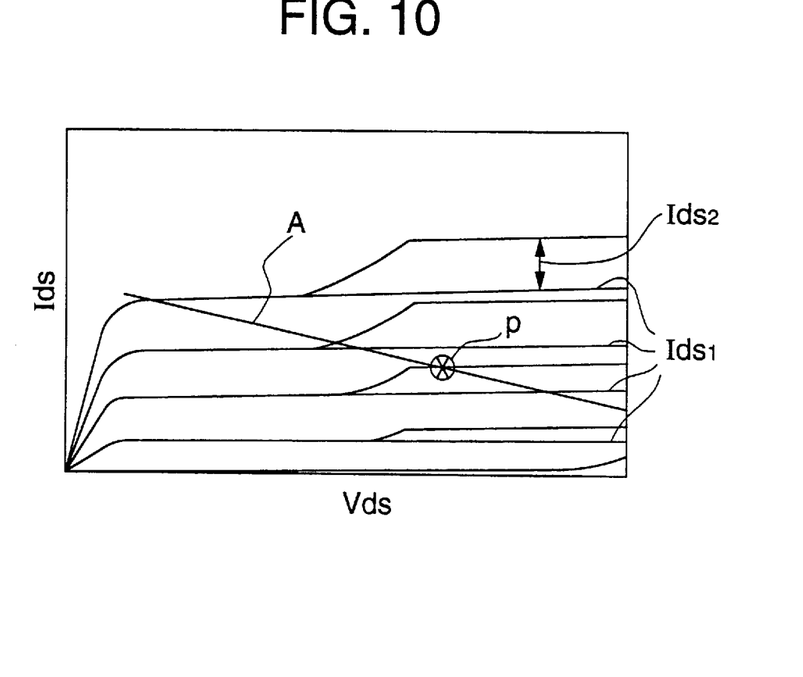
FIG. 10 is a graph showing an I-V characteristic of the MESFET of the fourth embodiment.

FIG. 10 is a graph showing an I-V characteristic of the GaAs MESFET having the above configuration. The horizontal axis represents the drain voltage $V_{ds}$, the vertical axis represents the drain current $I_{ds}$, and the parameter is the gate bias $V_{gs}$. Symbols A and p represent a load line and an operating point, respectively. In this I-V characteristic, the saturation drain current increases in a drain voltage range higher than a prescribed value.

The threshold voltage of the drain voltage $V_{ds}$ at which the drain current $I_{ds2}$ starts to flow increases as the dopant concentration of the n-AlGaAs layer 61 is decreased, or the n-AlGaAs layer 61 is made thicker.

For example, the threshold voltage is about 3 V when the n-AlGaAs layer 61 has an Al proportion X of 0.24, a doping concentration of $5 \times 10^{16}$ cm$^{-3}$ and a thickness of 300 Å.

When RF power is input to the gate of the GaAs MESFET having the I-V characteristic as shown in FIG. 10, a drain current waveform, which corresponds to the RF input power, can be distorted in the same manner as shown in FIG. 4 and therefore the applied dc power component can be reduced. As a result, highly efficient GaAs MESFET operation can be obtained.

Embodiment 5

Figure 11:
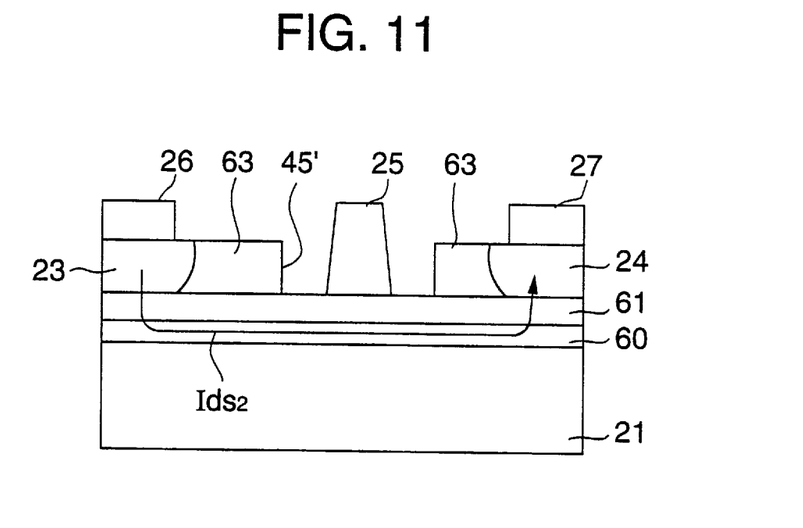
FIG. 11 is a sectional view of a MESFET according to a fifth embodiment of the invention.

FIG. 11 is a sectional view of a GaAs MESFET according to a fifth embodiment of the invention.

As shown in FIG. 11, the GaAs MESFET of this embodiment is different from that of the fourth embodiment in that a recess 45' penetrates the first active layer 63, i.e., so that the gate electrode 25 forms a Schottky junction directly with the n-AlGaAs layer 61. The remaining configuration of the fifth embodiment is the same as the fourth embodiment.

With this configuration, a drain current flows along only one path of the second active layer 60. Therefore, no current flows through the second active layer 60 unless the drain voltage $V_{ds}$ exceeds a prescribed threshold voltage. That is, the drain current $I_{ds2}$ is 0 when the drain voltage $V_{ds}$ is lower than the prescribed threshold value, and flows when the drain voltage $V_{ds}$ exceeds the prescribed threshold value.

Figure 12:
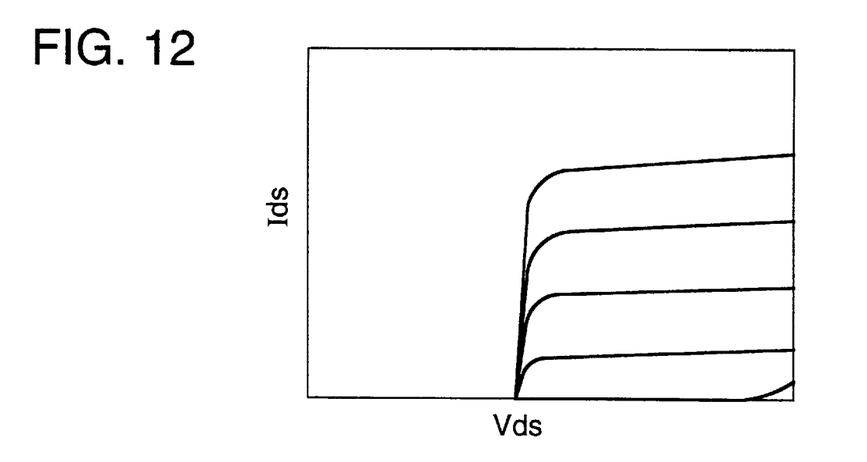
FIG. 12 is a graph showing an I-V characteristic of the MESFET of the fifth embodiment.

FIG. 12 is a graph showing an I-V characteristic of the GaAs MESFET of this embodiment. The horizontal axis represents the drain voltage $V_{ds}$, the vertical axis represents the drain current $I_{ds}$, and the parameter is the gate bias $V_{gs}$.

In the GaAs MESFET having the I-V characteristic shown in FIG. 12, the clipping changes steeply. Therefore, the average drain current, i.e., the dc component of the drain current, is reduced from the case where the drain current $I_{ds1}$ flows when the drain voltage $V_{ds}$ is higher than the prescribed threshold value, but the efficiency is increased as much.

Embodiment 6

Figure 13:
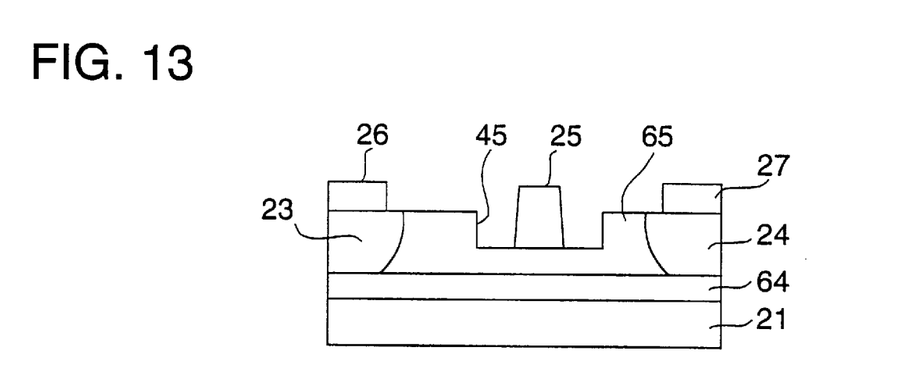
FIG. 13 is a sectional view of a MESFET according to a sixth embodiment of the invention.

FIG. 13 is a sectional view of a GaAs MESFET according to a sixth embodiment of the invention.

In FIG. 13, reference numeral 64 denotes an i-AlGaAs buffer layer (first semiconductor layer), and numeral 65 denotes an n-GaAs active layer (second semiconductor layer). The other reference numerals denote the same parts as in the fourth embodiment.

Referring to FIG. 13, the i-AlGaAs buffer layer 64, which is highly resistive, is epitaxially grown on one major surface of the semi-insulating GaAs substrate 21 to form a heterojunction. Further, the n-GaAs active layer 65 is epitaxially grown on the surface of the i-AlGaAs layer 64 to form a second heterojunction. The recess 45 is formed in the surface of the active layer 65, and the gate electrode 25 is formed on the surface in the recess 45. The source electrode 26 and the drain electrode 27 are provided on surface of the active layer 65 opposed to each other with the gate electrode 25 interposed in between.

In general, when an n-GaAs layer is epitaxially grown on an AlGaAs layer, the crystallinity of a portion of the n-GaAs layer close to the boundary between the two layers is poor. To avoid this problem, an i-GaAs layer is inserted between those layers.

In contrast, this embodiment utilizes the reduction in crystallinity. More specifically, the heterojunction structure is formed with the Al proportion X of the AlGaAs layer 64 set in a range of 0.1–0.8, to thereby produce a low-crystallinity layer at the AlGaAs/n-GaAs boundary.

In this embodiment, the low-crystallinity layer is produced at the boundary between the i-AlGaAs buffer layer 64 and the n-GaAs layer 65 by forming a direct heterojunction between the i-AlGaAs buffer layer 64 and the n-GaAs layer 65 of the GaAs MESFET. Electrons and holes are generated by collision ionization in the low-crystallinity layer when the drain voltage $V_{ds}$ is higher than a prescribed value. Among those carriers, electrons flow into the drain electrode 27, to increase the drain current $I_{ds}$.

Therefore, the GaAs MESFET of this embodiment exhibits an I-V characteristic similar to that of the fourth embodiment shown in FIG. 10. Therefore, when an RF power is input to the gate, a drain current waveform, which corresponds to the RF input power, can be distorted and therefore the applied dc power component can be reduced. As a result, a highly efficient GaAs MESFET can be provided.

The only change made in this embodiment is the insertion of the i-AlGaAs buffer layer 64 between the semi-insulating GaAs substrate 21 and the n-GaAs active layer 65. Therefore, the manufacturing process is simple, which allows provision of less expensive GaAs MESFET products.

What is claimed is:

1. A field-effect semiconductor device comprising:

a semi-insulating semiconductor substrate;

a semiconductor layer disposed on the semiconductor substrate;

a control electrode disposed on the semiconductor layer;

first and second electrodes disposed on the semiconductor layer opposed to each other with the control electrode interposed in between; and depletion layer forming means in the semiconductor layer between the control electrode and one of the first electrode and the second electrode for forming a surface depletion layer in the depletion layer forming means in response to a voltage applied to the control electrode so that the surface depletion layer is closer to the semiconductor substrate in the depletion layer forming means than is a depletion layer formed in the semiconductor layer opposite the control electrode in response to the voltage applied to the control electrode.

2. A field-effect semiconductor device comprising:

a semi-insulating semiconductor substrate;

a semiconductor layer having a dopant impurity concentration and disposed on the semiconductor substrate;

a control electrode disposed on the semiconductor layer;

first and second electrodes disposed on the semiconductor layer opposed to each other with the control electrode interposed in between; and a semiconductor region disposed in the semiconductor layer between the control electrode and one of the first electrode and the second electrode and having a dopant impurity concentration lower than the semiconductor layer.

3. A field-effect semiconductor device comprising:

a semi-insulating semiconductor substrate;

a semiconductor layer having a dopant impurity concentration and disposed on the semiconductor substrate;

a control electrode disposed on the semiconductor layer; and first and second electrodes disposed on the semiconductor layer opposed to each other with the control electrode interposed in between wherein a portion of the semiconductor layer located between the control electrode and one of the first electrode and the second electrode is thinner than a portion of the semiconductor layer opposite the control electrode.

4. A field-effect semiconductor device comprising:

a semi-insulating semiconductor substrate;

a semiconductor layer having a dopant impurity concentration and disposed on the semiconductor substrate;

first and second control electrodes disposed side by side on the semiconductor layer;

first and second electrodes disposed on the semiconductor layer opposed to each other with the first and second control electrodes interposed in between; and a feedback circuit having an output terminal connected to the second control electrode and an input terminal connected to one of the first and second electrodes for receiving an output voltage of the field-effect semiconductor device, the feedback circuit generating a feedback voltage applied to the second control electrode so that a depletion layer formed in the semiconductor layer in response to the feedback voltage is thicker than a depletion layer formed in the semiconductor layer in response to an input signal applied to the first control electrode.

5. The field-effect semiconductor device according to claim 1, wherein the semiconductor substrate is gallium arsenide.

6. The field-effect transistor according to claim 2, wherein the semiconductor substrate is gallium arsenide.

7. The field-effect transistor according to claim 3, wherein the semiconductor substrate is gallium arsenide.

8. The field-effect transistor according to claim 4, wherein the semiconductor substrate is gallium arsenide.

* * * * *